United States Patent
Pekonen

(10) Patent No.: US 8,230,293 B2
(45) Date of Patent: Jul. 24, 2012

(54) FORWARD ERROR CORRECTION

(75) Inventor: Harri J. Pekonen, Raisio (FI)

(73) Assignee: Nokia Corporation, Espoo (FI)

( * ) Notice: Subject to any disclaimer, the term of this patent is extended or adjusted under 35 U.S.C. 154(b) by 787 days.

(21) Appl. No.: 11/994,030

(22) PCT Filed: Jun. 29, 2005

(86) PCT No.: PCT/IB2005/052166
§ 371 (c)(1),
(2), (4) Date: Mar. 29, 2009

(87) PCT Pub. No.: WO2007/000627
PCT Pub. Date: Jan. 4, 2007

(65) Prior Publication Data
US 2009/0300468 A1   Dec. 3, 2009

(30) Foreign Application Priority Data
Jun. 29, 2005 (JP) .................................. 2005-190727

(51) Int. Cl.
*H03M 13/00* (2006.01)
(52) U.S. Cl. ....................................................... 714/752
(58) Field of Classification Search .................. 714/746, 714/752, 758, 776; 370/311
See application file for complete search history.

(56) References Cited

U.S. PATENT DOCUMENTS

| 5,182,752 A * | 1/1993 | DeRoo et al. ................. 714/758 |
| 5,701,329 A * | 12/1997 | Croft et al. ..................... 375/224 |
| 6,240,304 B1 * | 5/2001 | Blankenstein et al. ........ 455/574 |
| 2009/0055715 A1 * | 2/2009 | Jashek et al. ................. 714/776 |

FOREIGN PATENT DOCUMENTS

| WO | WO 9222145 A1 | 12/1992 |
| WO | WO 0156174 A2 | 8/2001 |
| WO | WO 2004084475 A1 | 9/2004 |

OTHER PUBLICATIONS

Patent Cooperation Treaty—Swedish Patent Office, PCT International Search Report, Mar. 15, 2006, 4 pages, PCT International Application No. PCT/IB2005/052166.

\* cited by examiner

*Primary Examiner* — Shelly A Chase
(74) *Attorney, Agent, or Firm* — Harrington & Smith

(57) ABSTRACT

A receiver is arranged to start receiving a data frame 80 including application data followed by parity data. An erasure information table is generated, and includes one element for each element of a data frame 80. If there are no errors in the application data, the receiver is powered-down to sleep without receiving the parity data, and the application data is used without correction being needed. If the number of errors in the application and parity data exceeds the MPE-FEC correction capability, the receiver is powered-down to sleep without further parity data being received and the data is not decoded. If the number of errors is smaller than the MPE-FEC correction capability, the receiver is powered-down to sleep when sufficient parity data is received to correct errors in the application and parity data. This can save power in the receiver. In another embodiment, the erasure information table includes one element for each column of a data frame.

17 Claims, 11 Drawing Sheets

FORWARD ERROR CORRECTION

CROSS-REFERENCE TO RELATED APPLICATIONS

This application is a United States national phase application of co-pending international patent application number PCT/IB2005/052166, filed Jun. 29, 2005, the disclosure of which is incorporated herein by reference.

BRIEF DESCRIPTION OF THE FIGURES

Embodiments of the present invention will now be described, by way of example only, with reference to the accompanying drawings, of which:

FIGS. 8A, 8B and 9c are flow charts illustrating decoder operation in the first embodiment, of the invention;

In the Figures, reference numerals are re-used for like elements throughout.

DETAILED DESCRIPTION OF EMBODIMENTS OF THE INVENTION

This invention relates to a method of operating a receiver including a forward error correction decoder, and to apparatus including a receiver and a forward error correction decoder.

It is proposed to use MPE level Forward Error Correction (MPE-FEC) in the Terrestrial Digital Video Broadcasting (DVB-T) broadcast system and in an extension of it termed DVB-H (DVB handheld), also previously known as DVB-X. Forward error correction is convenient since it allows a receiver to correct errors in received digital data without requiring any data to be retransmitted. This is likely to be of particular importance when the receiver is included in a mobile terminal.

MPE-FEC supports reception in situations of high Packet Loss Ratio (PLR) on the MPE section level. Such high PLR may occur for example on mobile channels (when high Doppler frequencies can be experienced) when the speed is too high, when the carrier-to-noise ratio is too low and/or due to impulse noise.

The MPE-FEC encoder in the transmitter side is usually placed in the IP encapsulator (IPE). The encapsulator stores data packets in a coding table or array, typically of a predetermined size. Forward error correction data is then calculated for each row of the array, and this forms parity data. This data is then entered into a portion of the array referred to as the parity data section but can also be termed RS (Reed Solomon) data table. One example of this is illustrated in FIG. 1.

Figure 1:
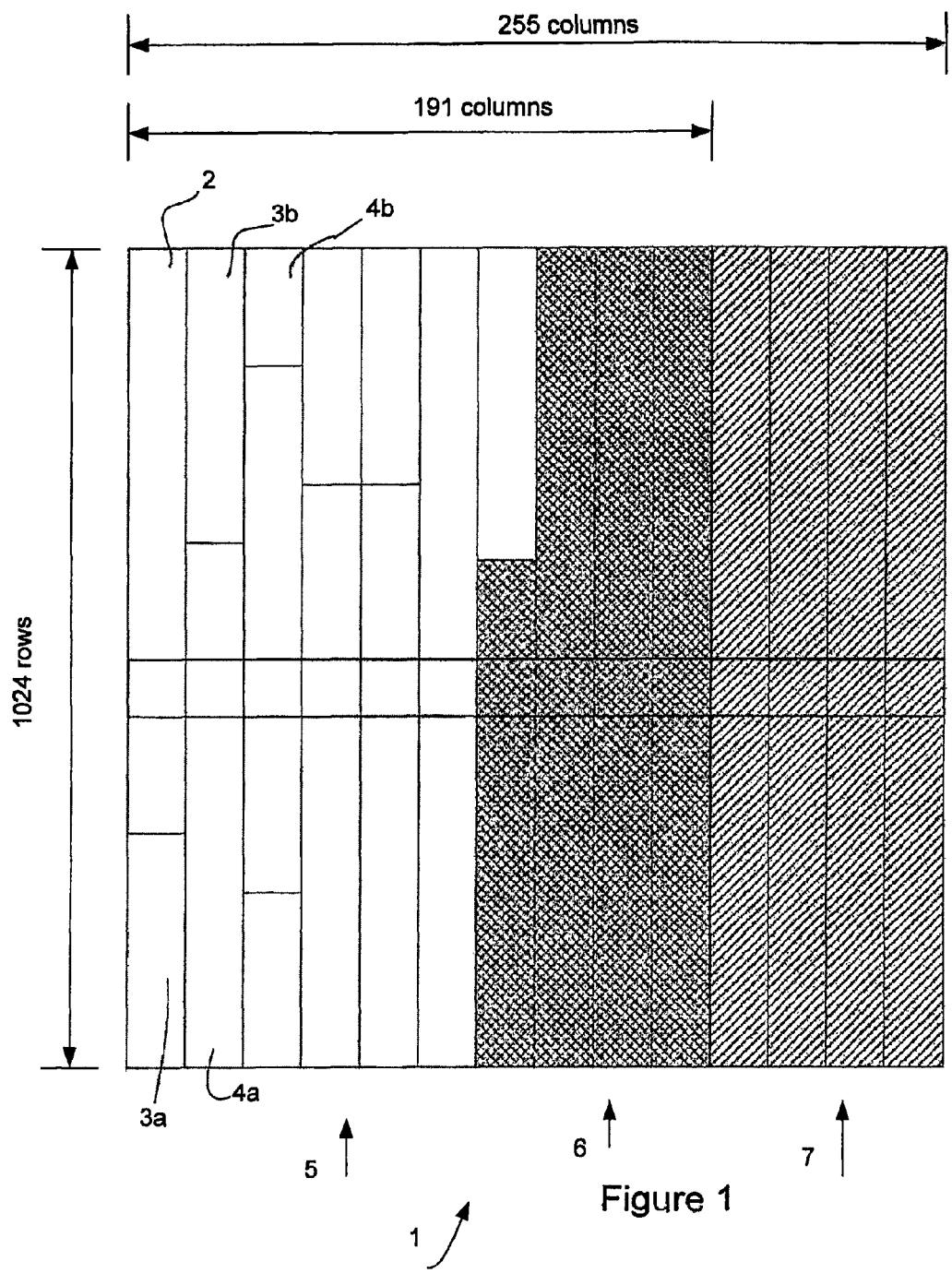
FIG. 1 is a schematic drawing of an exemplary coding array used to illustrate operation of FEC decoders and receivers.

Referring to FIG. 1, an exemplary coding array 1 is illustrated comprising 1024 rows of elements by 255 columns of elements. Convention is that the maximum number of rows in this example is 1024, although there can be fewer rows or more rows. The number of rows is signalled in a time_slice_fec_indicator_descriptor field of a DVB broadcast. Each element of the array stores one byte of data. A first 191 columns of elements are comprised of application data 5 (shown unshaded) and zero padding 6 (shown cross-hatched). The application data is made up of a number of datagrams, which are included sequentially in the table starting at the top left-hand corner and then filling up the columns in turn. The datagrams may be included in the table in the same sequence in which they were received, or datagram addresses in an MPE-FEC section header may specify some other order for the datagrams. In this example, a first datagram 2 is followed by a second datagram, which includes a portion 3a included in a first column, and a second portion 3b included in a second column. Similarly, a third datagram comprises a portion 4a in the second column and another portion 4b in a third column. Once all of the required datagrams have been included in the coding array, the elements which remain in the 191 columns and which have not been included with application data are zero padded, i.e. they are filled with zeros. Use of zero padding is known as code shortening. Following the filling of the first 191 columns with application data and zero padding, the parity data is calculated.

An exemplary way to prepare the parity data is using the Reed Solomon algorithm. This is calculated for each of the 1024 rows. For each of the 191 elements of application data and zero padding in a row, 64 elements of Reed Solomon parity data are generated and are included at the end of that row. Repeating this procedure for each of the 1024 rows result in the coding array 1 being completed with either application data elements, zero padding or parity data elements. Thus, using MPE-FEC, about 25% of TS (Transport Stream) data is allocated to parity overhead. The parity data section is indicated at 7 (shown with parallel line shading). The application datagrams are encapsulated in MPE sections and each column of RS parity data is encapsulated in a single respective, MPE-FEC section. Further, MPE and MPE-FEC sections are divided into the transport stream (TS) packets for transmission. The starting address of each datagram in the table is signalled to the receiver. This allows the coding array 1 to be reproduced easily at a receiver. The zero padding is not usually transmitted.

In the example of FIG. 1, the number of rows and columns is shown consolidated for ease of illustration.

The above described FEC procedure is referred to as RS (255,191), denoting Reed Solomon 255 columns, 191 of which are application data and zero padding. The Reed Solomon FEC procedure can correct errors in 32 of the elements in a row. If erasure information is used, errors can be corrected in 64 elements in a row.

Erasure information identifies which elements in the coding array 1 reproduced at a receiver have errors in them. Thus, an erasure information table can be produced having 1024 rows by 255 columns. There will be as many rows in the erasure information table as there are rows in the coding array 1. Although the coding array 1 has one byte of data in each element, the corresponding elements in the erasure information table includes only one bit. In this example, an element in the erasure information table is a 'zero' if the corresponding element is correct or a 'one' if the corresponding element is incorrect. Information needed to determine whether the data in a received element is correct or incorrect can be obtained from a Cyclic Redundancy Check (CRC) for Internet Protocol (IP) datagrams, or for MPE sections, or from the DVB-T Reed Solomon decoder for Transport Stream packets or from a combination of them. When determining whether or not an element is correct, the RS parity data 7 is treated equally to the application data elements 5. However, zero padding is always marked as correct when using erasure decoding if the location of the padding is known.

The Reed Solomon algorithm does not depend on the nature of the application data in the datagrams 2 to 4. Accordingly, this procedure is usable with multi-protocol encapsulation (MPE). This is seen to be particularly important with DVB-H, since the data may relate to audiovisual content, to audio content, or to file downloads amongst other things.

The MPE-FEC is introduced in such a way that an MPE-FEC ignorant (but MPE capable) DVB Receiver will be able to receive the MPE stream in a fully backwards-compatible way. This backwards compatibility holds both when the MPE-FEC is used with and without time slicing. The use of MPE-FEC is not mandatory. Its use is defined separately for each elementary stream in a TS. For each elementary stream, it is possible to choose whether or not MPE-FEC is used, and if it is used, to choose the trade-off between FEC overhead and RF performance, in particular through puncturing and zero-padding. Time critical services, without MPE-FEC and therefore minimal delay, could therefore be together with less time critical services using MPE-FEC, on the same TS but on different elementary streams.

It is known to identify which of the data included in the 191 columns in the coding array 1 is application data elements and which is zero padding through the use of two separate schemes. In the first scheme, a one-bit field in time-slicing and FEC real-time parameters which can be transmitted in the MPE or MPE-FEC header, is named as "table_boundary". This field is set to "1" for the MPE section carrying the last IP datagram in the current MPE-FEC table. If a receiver finds an MPE section where the table_boundary flag is set to one, the receiver can determine the starting point of the zero padding (assuming that the CRC check indicates that the last MPE section is correct). The starting address of the IP datagrams is signalled in the MPE section header. Normally, the starting point of the zero padding can be calculated from the starting address and length of the last IP datagram.

The second scheme includes an 8-bit field named "padding_columns" in an MPE-FEC section header. This field indicates the number of columns that include only zero padding. If a column includes both application data and zero padding, the entire column is treated as application data. This is described in ETSI standard 301192 V1.4.1

Data is sent sequentially from a buffer for broadcast. The maximum buffer size can be 512, 1024, 1536 or 2048 kbits. The parity data is sent following the application data but as part of the same burst.

The values given in the above example will be understood to be merely illustrative and not to limit the scope of the invention. The methods and notations according to ETSI standard 301 192 are to be understood as illustrative examples.

A significant proportion of the power consumed in a DVB receiver is consumed during reception of the data frame. For example, in an next generation DVB-H receiver, approximately 400 mW is expected to be consumed during reception of the data frame, although only 50 mW is expected to be consumed in transferring the data to the terminal, and 10 mW is expected to be consumed whilst the receiver is in sleep mode between reception of data frames.

It is an aim of the present invention to reduce the power consumed by a receiver when receiving data sent with forward error correction.

According to a first aspect of the present invention, there is provided a method of operating a receiver including a forward error correction decoder, the method comprising:

receiving application data elements of a data frame;
determining an error status of the received application data; and
selectively receiving parity data units of the data frame on the basis of the error status.

According to a second aspect of the present invention, there is provided apparatus comprising a receiver arranged to receive application data elements of a data frame, a forward error correction decoder arranged to determine an error status of the received application data, and a controller arranged to control the receiver selectively to receive parity data of the data frame on the basis of the error status.

Using the invention, power can be saved in the receiver. In particular, power need not be drawn to receive parity data units if those units are not needed. This applies when the received application data contains no errors, since there are no errors to correct with the parity data. This applies also if the application data contains (or the application data and the parity data together contain) a sufficiently high number of errors that correction using the parity data is not possible.

Figure 2:
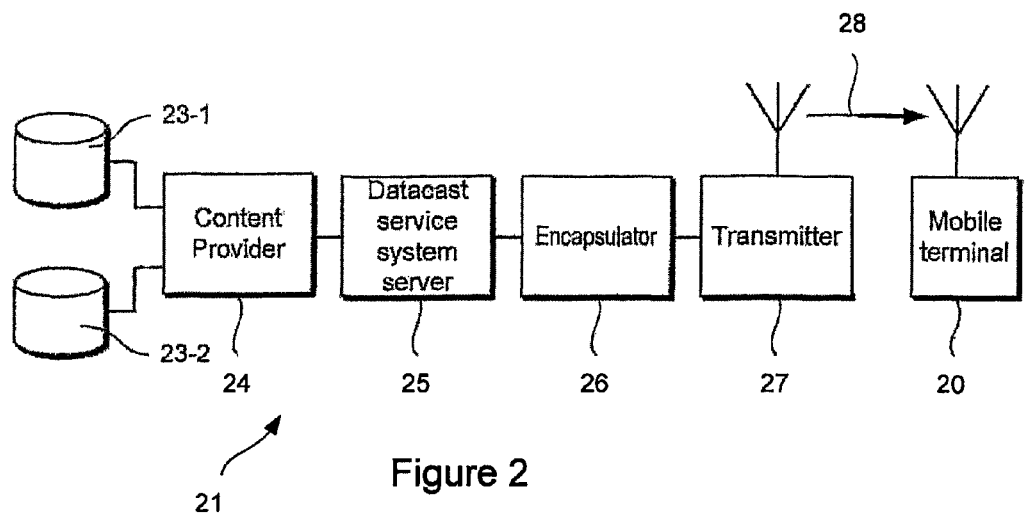
FIG. 2 shows an embodiment of a communication system in which the present invention may operate.

Referring to FIG. 2, a communications network 21 for delivering content to a mobile terminal 20 is shown. The communications network 21 includes a terrestrial digital video broadcasting (DVB-T) or a DVB-H network, which is used as a broadcast access network to deliver content for an Internet Protocol Data Casting (IPDC) service. However, other digital broadcast networks may be used including other types of DVB networks, such as a cable DVB network (DVB-C) or satellite DVB (DVB-S) network, a Digital Audio Broadcasting (DAB) network, an Advanced Television System Committee (ATSC) network, an Integrated Services Digital Broadcasting (ISDB) network, a Multimedia Broadcast Multicast Service (MBMS), or a Forward Link Only (FLO) network, for instance.

The communications network 21 includes sources 23-1, 23-2 of content, for example in the form of video, audio and data files, a content provider 24 for retrieving, re-formatting and storing content, a datacast service system server 25 for determining service composition, an Internet-Protocol (IP) Encapsulator (IPE) 26 and a transmitter 27 for modulating and broadcasting a signal 28 to receivers (not shown) including a mobile terminal 20.

Figure 3:
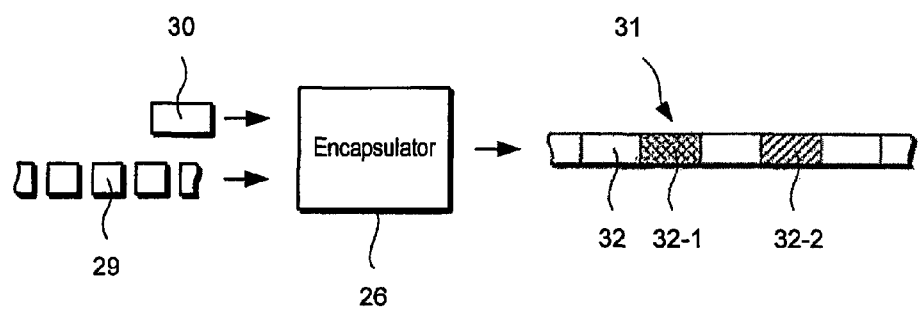
FIG. 3 shows an embodiment of a multiprotocol encapsulation (MPE) encapsulator forming part of the FIG. 2 system.

Referring to FIG. 3, the IP encapsulator 26 receives one or more streams of data 29 and service data 30 and generates therefrom MPEG program specific information (PSI) and DVB service information (SI), for inclusion in a transport stream 31 comprising MPEG-2 transport stream (TS) packets 32, typically 188 bytes long, according to International Organisation for Standards/International Electrotechnical Commission (ISO/IEC) Standard 13818-1 "Information Technology-Generic Coding of Moving Pictures and Associated Audio Information: Systems".

Figure 4:
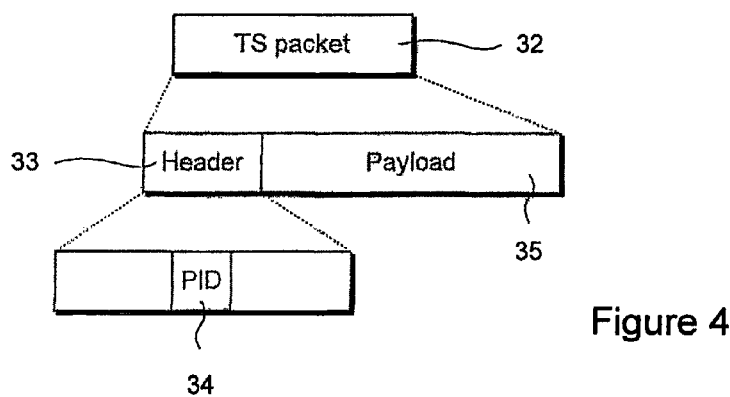
FIG. 4 illustrates an exemplary a transport stream packet.

Referring to FIG. 4, the transport stream 31 is divided into a number of logical channels, referred to as "elementary streams". The elementary stream to which a TS (transport stream) packet 32 belongs is defined in a packet header 33 using a packet identifier (PID) 34. The PID 34 is used to identify elementary streams. Certain PIDs are reserved for SI tables, and some are reserved for PSI tables. There is a range of PIDs to which MPE/MPE-FEC section streams can be put. Accordingly, it can be determined from the PID 34 if the particular elementary stream contains a particular SI table or MPE section stream. Thus, the packet identifier 34 can be used to identify contents of a TS packet payload 35 in some cases.

For example, the contents of a first TS packet 32-1 may be identified as containing all or part of a network information table (NIT) by specifying PID=0x0010 (as a hexadecimal number). The contents of a further TS packet 32-2 may be identified as being video, audio or another type of data by specifying a PID value between 0x0030 to 0x1FFE (hexadecimal). A range of PIDs is allocated to MPE/MPE-FEC section streams.

Referring again to FIG. 2, the DVB transmitter 27 receives a signal from the encapsulator 26 which it modulates, amplifies and broadcasts.

Other network elements may be provided, such as a multiplexer (not shown) for combining a plurality of services (although an IPE can provide plural services), and a gap-filler transmitter for receiving and re-transmitting the signal 28. Furthermore, another communications network (not shown), such as a public land mobile network, preferably in the form a 2nd or 3rd generation mobile network such as GSM or UMTS respectively, may be provided for providing a return channel from the mobile terminal 20 to the communications network 21. A further communications network (not shown), such as the Internet, may be provided to connect distributed elements of the communications network 21, such as the content provider 24 and the service system server 25.

The IP encapsulator 26 generates forward error correction (FEC) data packets and assembles them into bursts comprising application data, and multiplexes transport stream packets into a single transport stream. The IP encapsulator may be implemented in software and/or hardware.

Figure 5:
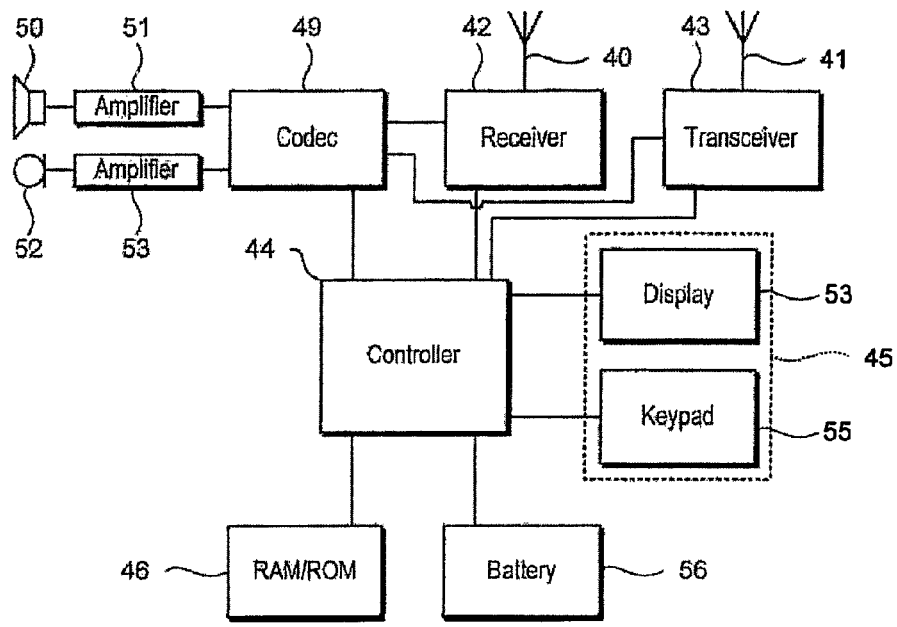
FIG. 5 illustrates schematically a mobile terminal included in the FIG. 1 system and implementing the invention.

Referring to FIG. 5, one embodiment of the mobile terminal 20 is shown schematically in the form of a combined mobile telephone handset and DVB-H receiver.

The mobile terminal 20 includes first and second antennas 40,41, a DVB-H receiver 42 and a mobile telephone transceiver 43. The receiver 42 and the transceiver 43 each include RF signal processing circuits (not shown) for amplifying and demodulating received signals and may include one or more processors (not shown) for channel decoding and demultiplexing.

The mobile terminal 20 also includes a controller 44, a user interface 45, one or more memories 46, a encoder/decoder (codec) 49, a speaker 50 with corresponding amplifier 51 and a microphone 52 with a corresponding pre-amplifier 53.

The user interface 45 comprises a display 53 and a keypad 55. The display 53 is adapted for displaying images and video by, for instance, being larger and/or having greater resolution than a display of conventional mobile telephone and being capable of colour images. The mobile terminal 20 also includes a power source in the form of e.g. a rechargeable battery 56, to provide DC power.

The controller 44 manages operation of the mobile terminal 20 under the direction of software (not shown) stored in one of the memories 46. The controller 44 provides output signals for the display 53 and receives and processes inputs from the keypad 55.

The mobile terminal 20 may be modified by providing a single receiver adapted to receive signals from the DVB-T network 21 and the mobile telephone network and a transmitter adapted to transmit signals on the mobile telephone network (not shown). Alternatively, a single transceiver for both communications networks may be provided.

Figure 6:
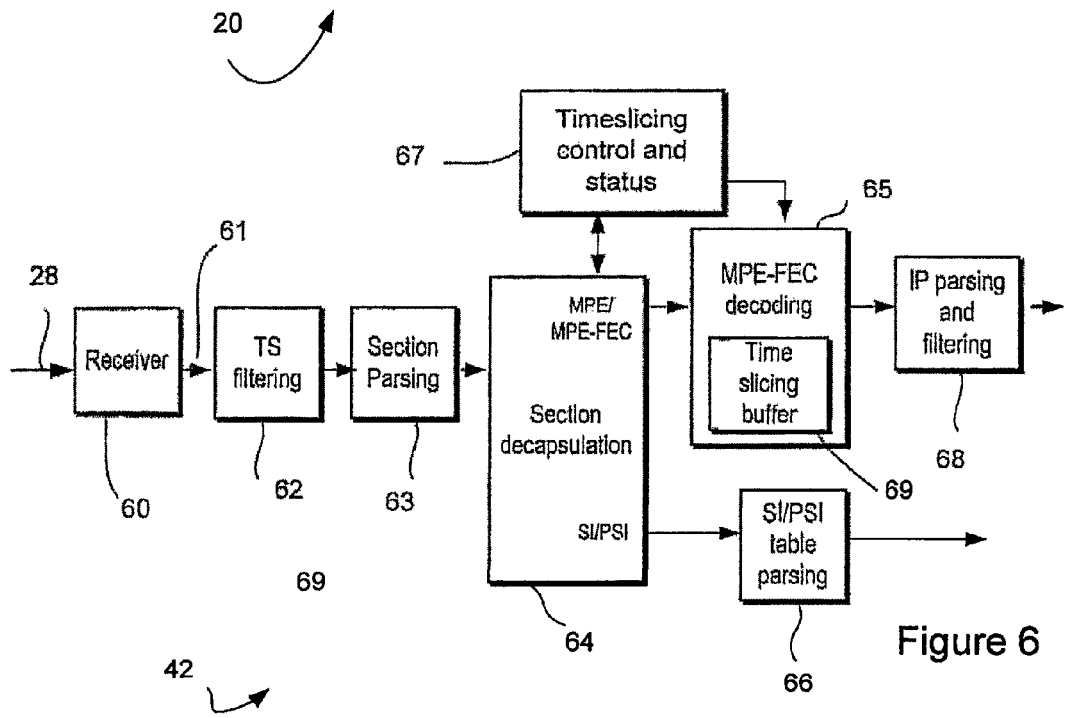
FIG. 6 shows operation of certain parts of the FIG. 5 mobile terminal, including a receiver and a decoder according to and operating according to the invention.

Referring to FIG. 6, part of the DVB-H receiver 42, is shown in more detail in the form of a functional block diagram. The receiver 42 is intermittently switched on to receive the time-sliced signal 28 from the first communications network 21. The signal 28 is amplified, demodulated, channel decoded and demultiplexed into elementary streams by an RF receiver section 60 and provided at an output 61. The RF receiver section 60 forms part of the DVB-H receiver 42, and may be separate from the other components of FIG. 6, which have more of a data processing role. The elementary streams include TS packets carrying application data bursts.

A TS filtering block 62 receives the TS stream from the RF receiver section 60. The TS filtering block 62 uses the PID value for the TS packets to filter them, and allows to pass through it only the TS packets belonging to the desired elementary streams. TS packets belonging to other elementary streams may be discarded or routed elsewhere as required.

A section parsing block 63 decapsulates the payload of the TS packets passed to it by the TS filtering block 62, and forms sections from these payloads. In doing this, it takes into account the possible adaptation field and Payload Unit Start Indicator (PUSI). The sections formed by this include IP datagrams.

A section decapsulation block 64 extracts from the result of the section parsing block 63 the real time parameters and the payload of each section. Using data in the table_id field of the sections to determine whether the section relates to MPE/MPE-FEC data or SI/PSI data, it sends the payload along with some real time parameters into whichever is appropriate of an MPE/MPE-FEC decoding block 65 and an SI/PSI table parsing block 66. All of the extracted real time parameters are fed also to a timeslicing control and status block 67. The timeslicing control and status block 67 analyses the real time parameters, and uses it to generate status data as appropriate. It also informs the MPE-FEC decoding block 65 when the maximum burst duration has elapsed. This information is needed by the MPE-FEC decoding block 65 to know to start decoding if the end of a burst is lost.

The MPE-FEC decoding block 65 writes the section payloads into an MPE-FEC frame according to address information (which is a real time parameter). It decodes the whole MPE-FEC frame row by row. This decoding is able to use erasure information, as described elsewhere in this specification, although the MPE-FEC decoding block 65 may be controlled instead to effect decoding without using erasure information as and when this is deemed appropriate. The MPE-FEC decoding block 65 includes some memory in which is stored erasure information and some memory in which is stored the data of the MPE-FEC frame. These memories may form part of the same memory device, as shown at 69 in the Figure, or they may be on different memory devices. As described below, the erasure information can be obtained from the section CRC-32 or, if the erroneous TS packets are passed forward, from the transport error indicator located in the header of the TS packet. The MPE-FEC decoding block 65 is controllable also not to use MPE-FEC error-correction decoding. When operating in this way, the MPE-FEC decoding block 65 functions merely as a time slicing buffer, storing one burst at a time.

Connected to an output of the MPE-FEC decoding block 65 is an IP parsing and filtering block 68. This receives whole MPE-FEC frames from the MPE-FEC decoding block 65. The IP parsing and filtering block 68 scans the corrected data areas in the frame and detects IP datagrams that were originally erroneous but were corrected by the decoder. It provides at its output only IP datagrams having a desired IP address.

Although in the above the SI/PSI data is not provided with MPE-FEC encoding, this is not essential. It may instead be delivered in a manner similar to that of the IP datagrams carrying application data.

Two embodiments of the invention will now be described. In each embodiment the hardware described above in relation to FIGS. 5 and 6 is used.

The first embodiment will now be described with reference to FIGS. 7, 8A, 8B and 8C in particular.

Figure 7:
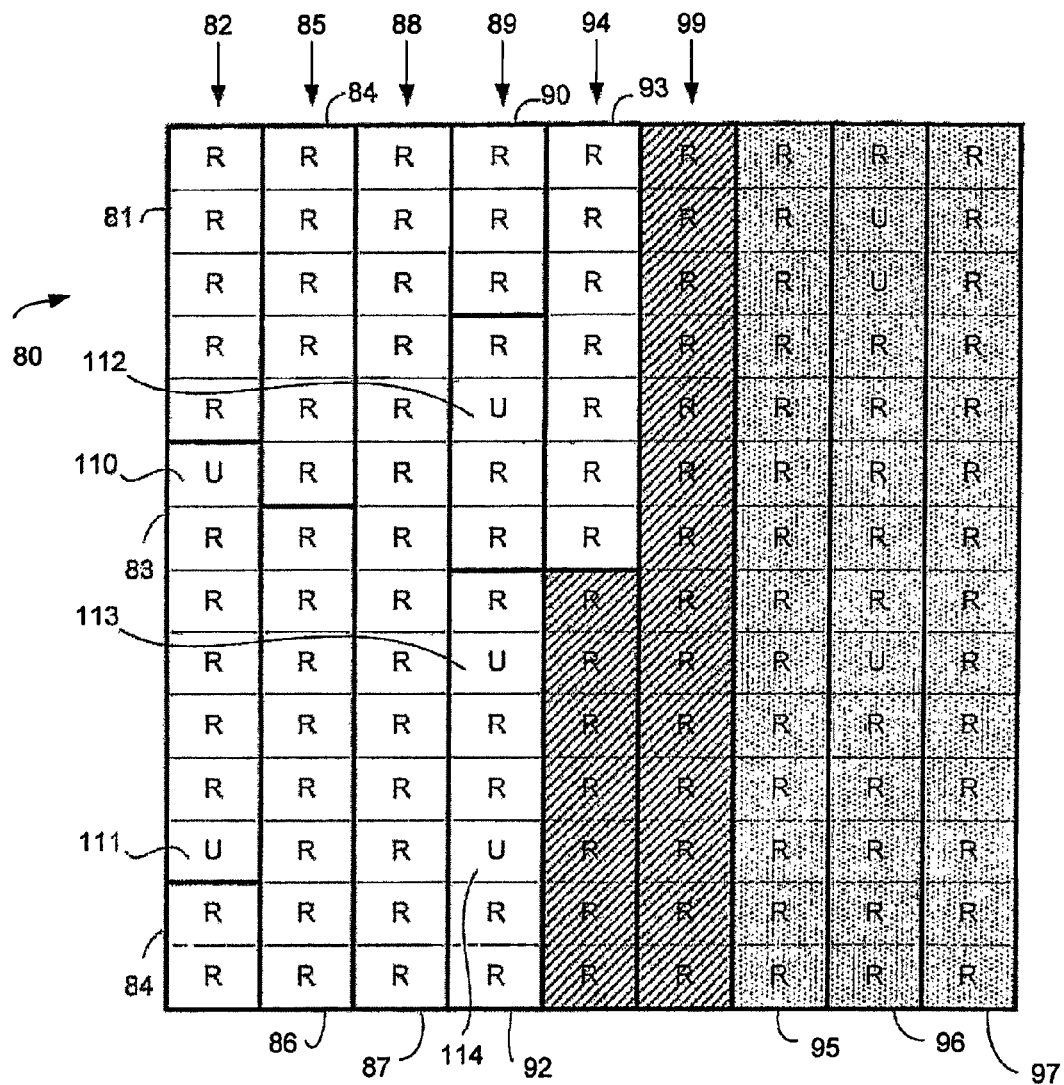
FIG. 7 is a schematic drawing of a coding array or data frame used to illustrate a first embodiment of the invention.

FIG. 7 shows a simplified data frame. The data frame 80 is illustrated as having fourteen rows of data, and nine columns of data. There are thus 126 elements illustrated in the Figure. The nine columns of data comprise six columns of application and padding data and three columns of parity data. However, it will be appreciated that in most examples a data frame contains many more elements. For example, the maximum number of rows allowed by the present version (V1.4.1) of the ETSI standard, when there are 255 columns, can be 512, 1024, 1536 or 2048 rows. Of the 255 columns of data, there are usually 191 columns of application and padding data and 64 columns of parity data.

A first datagram 81 is included in a first column 82 of the first data frame 80. This is followed by a second datagram 83, which is also wholly within the first column. A third datagram 84 includes a portion in the first column and a portion also in a second column 85 of the data frame 80. A fourth datagram 86 completes the second column 85. A fifth datagram 87 occupies the entirety of a third column 88. A fourth column 89 includes sixth, seventh and eighth datagrams 90, 91 and 92. A ninth datagram 93 is included in a fifth column 94. The remainder of the fifth column 94 and the entirety of a sixth column 99 is comprised of zero padding. First, second and third parity data columns 95, 96 and 97 follow the end of the sixth application data column 99. The first to ninth datagrams 81, 83, 84, 86, 87, 90, 91, 92, 93 are marked by the thick borders in FIG. 7.

An erasure information table (which is shown superposed on the data frame 80 in the Figure) includes one bit for each element of the data frame 80. Thus, the size in bits of the erasure information table is equal to the number of elements (each of one byte) in the data frame 80. The erasure information table is stored in the RS decoder 89.

In this example, the second, seventh and eighth datagrams 83, 91 and 92 are received with errors, and the other datagrams are received error free. In the Figure, elements received with one or more errors are marked by a 'U', and elements received error-free are marked by an 'R'. In this example, it can be seen that it is a first element 110 and a last element 111 of the second datagram 83 that are received with one or more errors. A second element 112 of the seventh datagram 91 is received with one or more errors. A second element 113 and a fifth element 114 of the eighth datagram 92 are received with one or more errors.

Figure 8A:
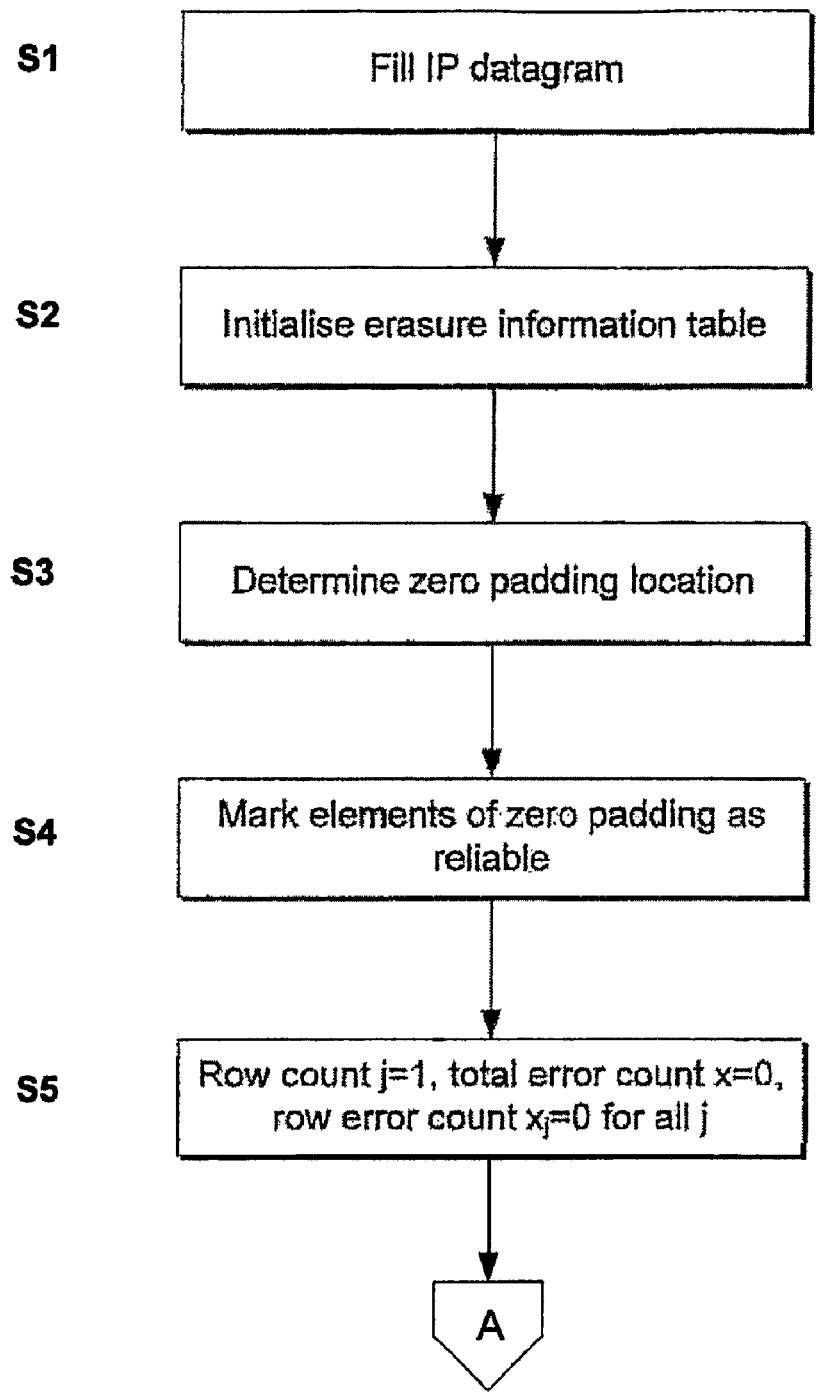
Figure 8B:
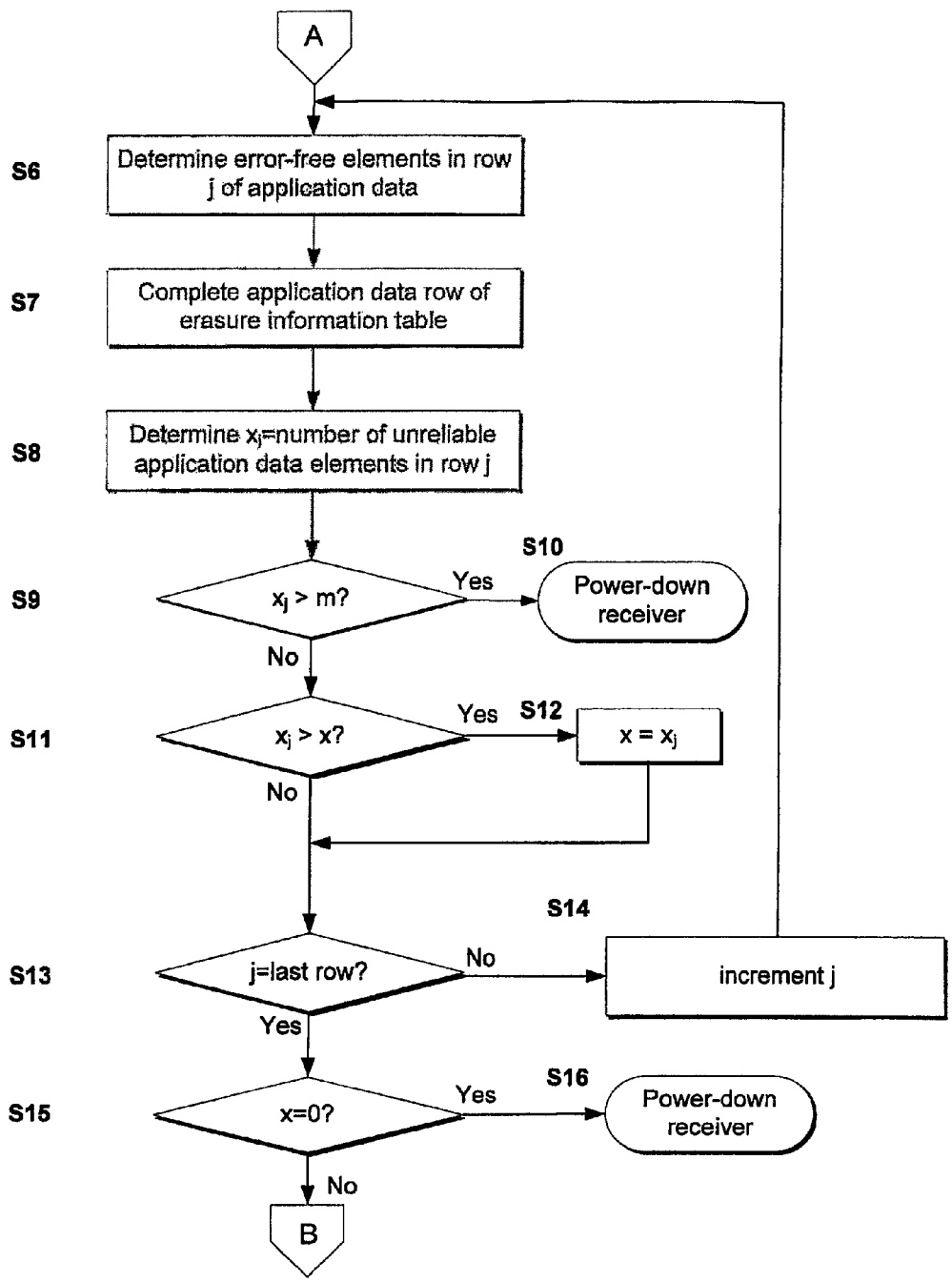
Figure 8C:
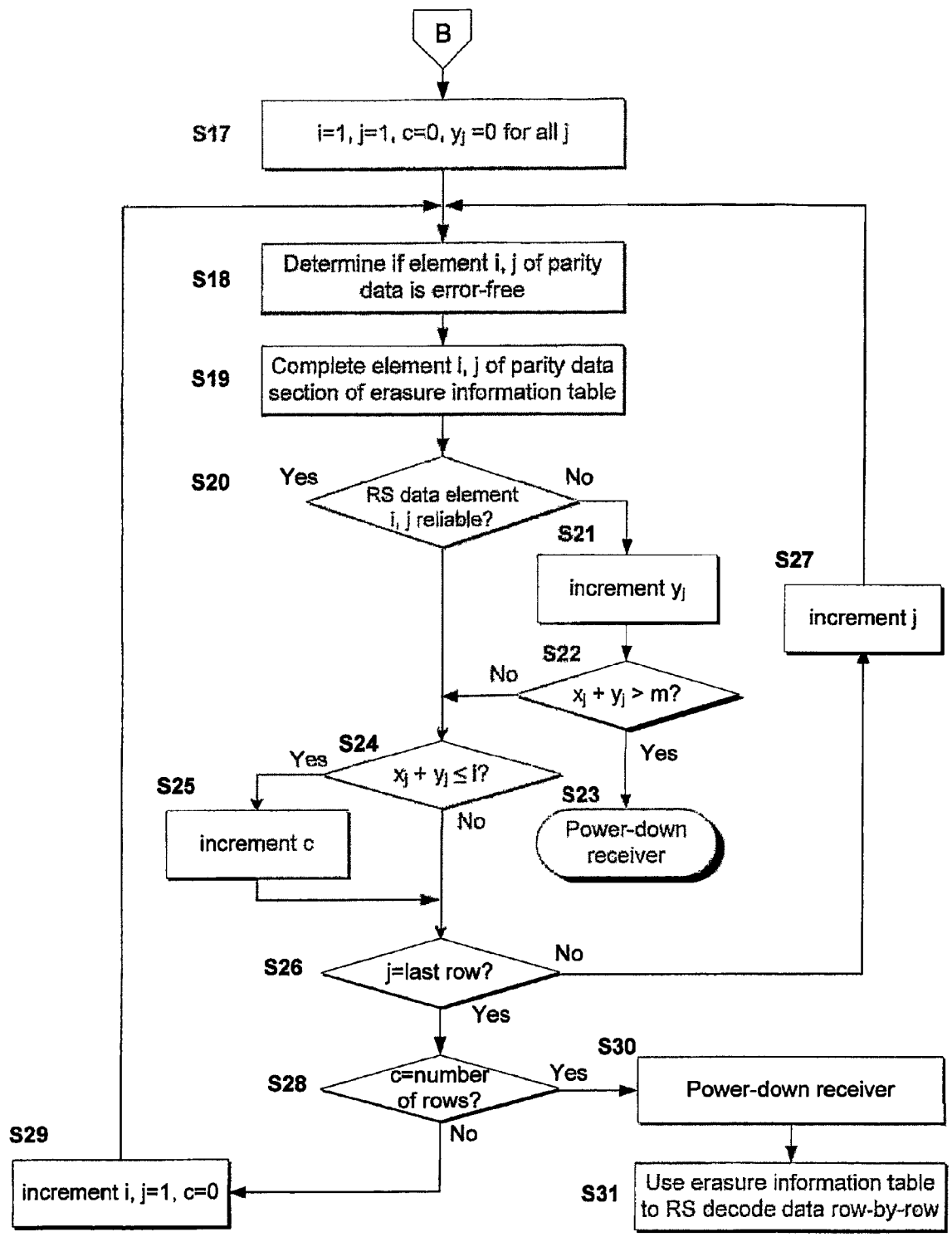

Referring now to FIGS. 8A, 8B and 8C, a first example of operation of the mobile terminal 20 is now described in detail. In this example, a decision as to whether or not to perform forward error correction is performed in respect of each row.

At step S1, the IP datagram buffer 69 is filled with received data, constituting the application data and zero-padding data frame 80. As will be appreciated, the zero-padding usually is not transmitted, so it is replicated by the mobile terminal. The RS data has not been received at this point since it is transmitted after the application data frame 80. This received data is written into a table like that shown in FIG. 7 before decoding. The data frame 80 contains a number of elements equal to the number of rows in the data frame 80 multiplied by the number of columns therein. Each element comprises one byte of data. In this example, there are six columns of application and zero padding data and three columns of parity data (yet to be received), although it will be appreciated that this is merely an exampled selected to allow the invention to be easily understood.

At step S2, the erasure information table 98 is initialised. This involves including in each of the elements of the erasure information table 98 data a value indicating that data in a column of the data frame 80 corresponding to the element of the erasure information table is unreliable. Typically, the bit value "0" indicates unreliable data, although this is not essential. At step S3, the location of the zero padding is determined, in any suitable way. At step S4, elements of the erasure information table that correspond to elements consisting of zero padding data are marked as being reliable. If the receiver 42 is not able to determine the location of the zero padding, for example because the MPE section header contains errors, then the columns of zero padding are marked as being unreliable.

At step S5, some counters are initialised. A row count j is set to unity. The row count j determines which row of the application data is currently being processed. A maximum error count x is set to 0. The maximum error count x represents the number of elements containing one or more errors, in the row of application data which contains the greatest number of errors. A row error count, $x_j$ is set to 0 for all j (i.e. for j=1 to j=14 in this case). The row error count, $x_j$ represents the number of errors in the jth row of the application data.

At step S6, it is determined which elements in the first row of application data are error-free. At step S7 the elements in the first row of the erasure information table corresponding to application data are marked accordingly.

In step S8, $x_1$, which is the number of unreliable data elements in the first row, is determined. At step S9, it is determined whether the number of errors in the current row is greater than the MPE-FEC correction capability, m. The value of the MPE-FEC correction capability depends on a number of factors. These factors include the number of columns of parity data, whether or not an erasure information table is used, and whether puncturing is performed on the parity data. In this case, no puncturing is present, an erasure table is used, and the parity data is RS data. The MPE-FEC correction capability is thus equal to the number of columns of parity data. Where the coding array 1 has 255 columns and a Reed Solomon algorithm is used, m is equal to 64. However, in this embodiment, the MPE-FEC correction capability, m, is equal to three. If any row is found to contain more errors than the MPE-FEC correction capability, the receiver 42 is powered-down to sleep at step S10. Because the decoding is usually performed row-by-row, the decoder will not be able to decode the application data using the RS data if any row is received with too many errors. Since reception of further RS data in this case cannot have any positive effect, powering-down the receiver 42 results in a saving of power without any reduction in performance. The receiver 42 is powered down only until it is required to receive another burst of data. If step S9 yields a negative result, operation proceeds to step S11.

At step S11, it is determined if the current row has been found to contain more elements containing errors than any of the previous rows. If the outcome is true, the operation proceeds to step S12, where x is set to the value of $x_j$.

Whether the outcome of step S11 is true or false, the operation proceeds to step S13, where it is determined if the current row is the last row. If the result is false, the row count j is incremented at step S14. The steps S6 to S13 are carried out for each row of the application and padding data.

When j=14, and step S13 is reached, it is determined that the current row is the last row, and the operation proceeds to step S15. At step S15, it is determined if any unreliable elements, that is elements containing errors, were found. If no unreliable elements were found, the receiver 42 is powered-down to sleep at step S16. If there are no errors, then no parity data is required, so powering-down the receiver 42 results in a saving of energy without any reduction in performance. The extent of the energy saving depends on the ratio of RS data to application data. It depends also on the speed of the receiver 42 determining that the RS data is not required, since the RS data typically will be being received in the meantime. The receiver 42 is powered down only until it is required to receive another burst of data. In the meantime, the received application data can be decoded.

If any errors are found in the application data, the operation proceeds to step S17. In this embodiment, the number of error-free elements of parity data required for each row is decided based on the number of unreliable elements in the poorest row, as described in detail below.

At step S17, some further counters are initialised. A column count, i, is set to one. The column count represents the column of parity data currently being checked for errors. The row count, j, is reset to unity. A counter c is set to 0. For each row being checked, c is incremented if it is determined that enough parity data elements have been received to correct the errors in the application and parity data in that row. A row error count $y_j$, is set to zero for all j. $y_j$ represents the number of errors present in the jth row of parity data.

At step S18, when element i, j, of the parity data is received, it is determined if this element is error-free. Since the receiver 42 does not control when the parity data is transmitted, the step of receiving the parity data 95 commenced previously, e.g. immediately after receiving the application data. Parity data 95 is buffered if received prior to step S18 commencing. The check for errors can be performed using a CRC of the corresponding MPE-FEC section. At step S19, the corresponding parity data element of the erasure information table 98 is marked accordingly.

At step S20, the reliability of the first parity data element of the erasure information table is checked. If the data is not reliable, the operation proceeds to step S21. At step S21, the counter $y_1$ is incremented, to indicate that a parity data element containing one or more errors has been received in the first row. At step S22, it is determined if the total number of elements of application and parity data received containing errors in the first row is more than the MPE-FEC correction capability, m. If the outcome is true, the receiver 42 is powered-down to sleep at step S23, since reception of further RS data could have no positive effect, for reasons discussed above, and the amount of RS data received before the conclusion that the errors are not correctable could be made. The receiver 42 is powered-down only until it is required to receive another burst of data.

If the outcome of step S20 is true, or the outcome of step S22 is false, the operation proceeds to step S24.

At step S24 it is determined if the number of parity data elements and application data elements received with errors in the fifth row is less than or equal to the number of parity data elements received in the fifth row. That is, it is determined if sufficient parity data columns have been received to correct all of the errors in the application data and parity data. If the result is true, the counter c is incremented to indicate that sufficient parity data elements have been received in the row. In either case, the operation proceeds to step S26, where it is determined whether the current row is the last row. If the result is false, then the row count j is incremented at step S27, and steps S18 to S26 repeat for the next row.

When j=14 in the column, the result of step S26 is true, and the operation proceeds to step S28. At step S28, it is determined whether c is equal to the number of rows. If the outcome is true, enough parity data has been received in each row to correct the errors in the application and padding data in all rows. The operation then proceeds to step S30, where the receiver 42 is powered-down. At step S31, the erasure information table 98 is used to decode the data constituting the data frame 80 row by row. This is carried out by the RS decoder 69 in a conventional way. The receiver 42 is powered down only until it is required to receive another burst of data.

If the outcome of step S28 is false, the column counter is incremented, the row counter j is reset to 1, and c is reset to 0, and the operation returns to step S18.

The operation of FIGS. 8A, 8B and 8C will now be described during reception of the data frame 80 of FIG. 7.

At step S1, the IP datagram buffer 65 is filled with received data, constituting the application data and zero-padding data frame 80. At step S2, the erasure information table 98 is initialised, in the same way as described above. At step S3, the location of the zero padding is determined, in any suitable way. At step S4, elements of the erasure information table that correspond to elements consisting of zero padding data are marked as being reliable. In FIG. 7, the last seven elements of the fifth column 94 and all the elements of the sixth column 99 consist of zero padding data and are therefore marked as being reliable.

At step S5, the counters are initialised. At step S5, it is determined which elements in the first row of application data are error-free. In this case, all the elements in the first row are error-free. Thus, in step S7 the elements in the first row of the erasure information table corresponding to application data are marked accordingly, i.e. the first five elements in the first row are changed to show that the data in the corresponding application data elements is reliable.

In step S8, $x_1$, which is the number of unreliable data elements in the first row, is found to be zero. At step S9, it is determined whether the number of errors in the current row is more than the MPE-FEC correction capability. In this case, it is not. At step S11, it is determined if the current row has been found to contain more elements containing errors than any of the previous rows. In this case, the result is false, and the operation proceeds to Step S13, where it is determined that the current row is not the last row. Therefore, the operation proceeds to step S14 where the row count j is incremented to two.

The outcome of steps S6 to S14 is the same for the next three rows (j=2, 3, 4), since these rows also contain only error-free application data elements. At step S6, when j=5, the first, second, third and fifth elements are found to be error-free. Thus, at step S7, the first, second, third and fifth elements in the fifth row of the erasure information table are marked accordingly i.e. they are changed to show that these elements are reliable. The fourth element in the fifth row of the erasure information table is not changed, and therefore the element is shown as being unreliable. The condition at step S9 is found to be false, since as previously mentioned the MPE-FEC correction capability of the data frame 80 is three. In step S11, it is determined if the current row has been found to contain more elements containing errors than any of the previous rows. Since all of the previous rows contained no errors, and the current row has one element that contains one or more errors, the condition is true and the operation proceeds to step S12. At step S12, the maximum error count x is set to one, since this is the maximum number of unreliable elements in a row that has been found at this stage.

Steps S6 to S14 repeat for each row. When j=14, all the rows are completed. The maximum error count x has the value two, since the twelfth row contains 2 unreliable elements 111, 114 and no row was found to contain more unreliable elements. At step S13, it is determined if the current row is the last row of the data frame. The condition is true, so the operation proceeds to step S15, where it is determined if any unreliable elements were found. In this example, x=2, so the operation proceeds to step S17.

At step S17, the counters are initialised. At step S18, it is determined that the first element is error-free. At step S19, the first parity data element of the erasure information table 98 is changed to show that this element is reliable.

In step S20, the reliability of the first parity data element of the erasure information table is checked. The element is found to be reliable, so the operation proceeds to step S24. At step S24, since $x_1=0$ and $y_1=0$, i.e. no errors have been found in this row, and the column count is 1, the condition is true. Therefore, the operation proceeds to step S25 and c is incremented to one. The condition of steps S26 is found to be false, since this is not the last row. At step S27, j is incremented to two, and steps S18 to S27 repeat for all the elements in the first column of parity data, in the same way as described above, except for the twelfth row. At step S24 for j=12, the outcome is false. This is because there $x_{12}=2$, i.e. there are two application data elements containing errors in the 12th row. Thus, insufficient parity data elements have been received to correct the errors, and c is not incremented.

At step S26, when j=14, it is determined that the current row is the last row, and the operation proceeds to step S28. At steps S28, c is found to be 13, since in all rows except the twelfth row sufficient parity data has been received. The condition of steps S28 is thus found to be false. Therefore, the operation proceeds to step S29, where the column counter i is incremented, and the row count j and the counter c are reset.

The second column of parity data is received in the same way as the first. However, when j=2, the result of the condition at step S20 is found to be false, i.e. the RS data element in the second column and the second row is unreliable. The row error count $y_j$ is incremented to one. However, the condition of step S22 is found to be false, since the total number of errors in the second row is one, which is less that the MPE-FEC correction capability, m, which in this example is three. At step S24, the condition is found to be true, since a total of one error has been found in the application and parity data, but two columns of parity data have been received. Thus c is incremented for this row. The operation repeats for the remaining rows. In this case, when i=2 and j=12, the condition of step S24 is found to be true, since at this point, $x_{12}=2$, $y_{12}=0$ and i=2. Thus, c is incremented for all the rows. Thus, when j=14 and step S28 is reached, the condition is found to be true. That is, in all rows, sufficient parity data is received to correct the errors on the application data and parity data.

The receiver 42 is then powered-down to sleep at step S30, and the data is decoded row by row at step S31. Thus, in this example, power is saved by stopping reception before the third column of parity data is received fully, since the third column of parity data is not needed to correct the errors in the data.

The first data frame 80, and second data frame 80', contain first to ninth datagrams, in the same configuration as the data frame 80 of FIG. 7. In this example, for the first data frame 80, the second, seventh and eighth datagrams 83, 91 and 92 are received with errors and the other datagrams are received error-free. Furthermore, the second column of parity data 96 is received with errors. The other datagrams in the other columns of parity data received error-free.

In the second datagram 80', the sixth datagram 87' is also received with errors. Thus, the second, sixth, seventh and eighth datagrams 83, 87, 91, 92 are received with errors and the other datagrams are received error-free. Again, the second column of parity data 96' is received with errors.

Figure 11A:
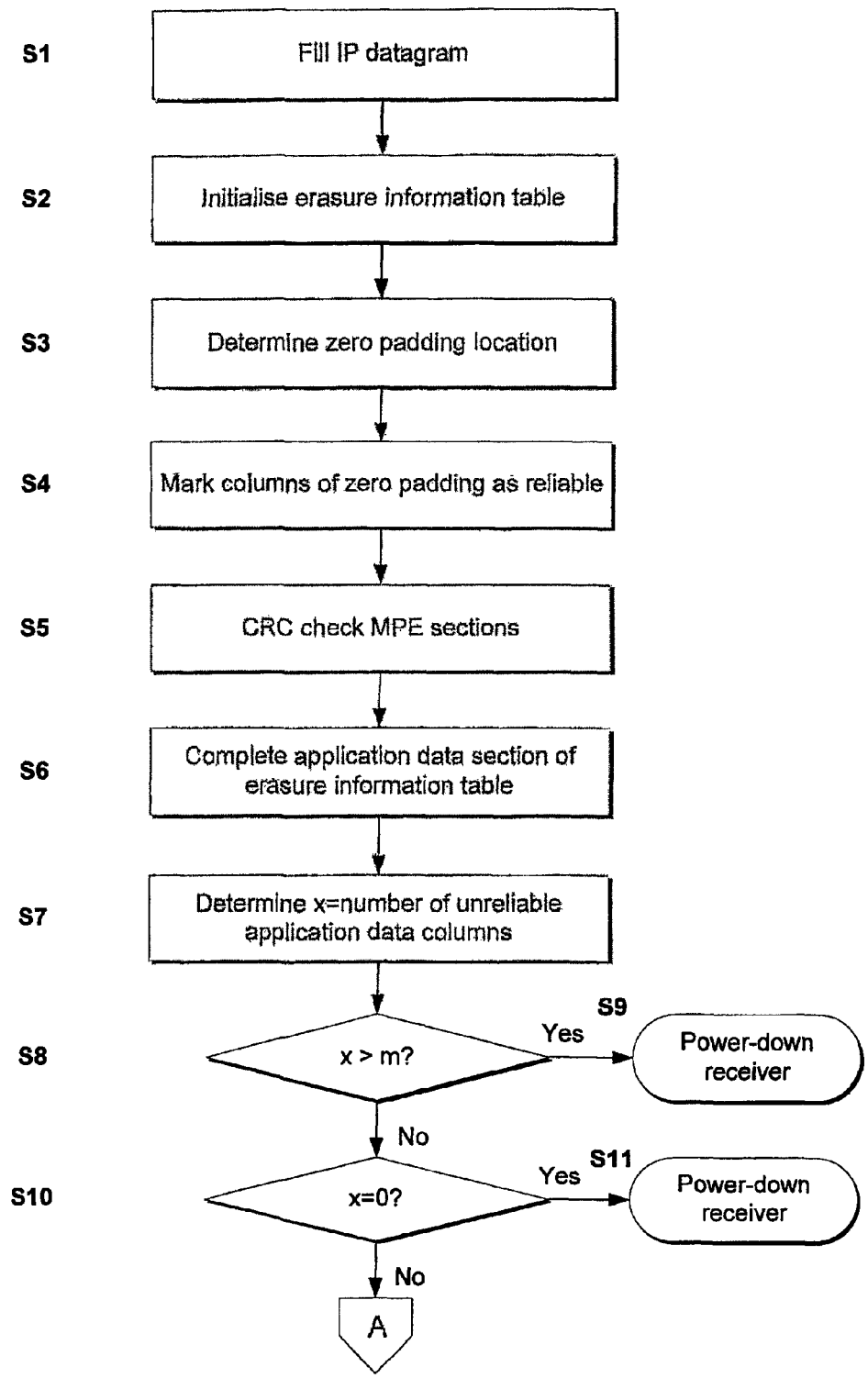
FIGS. 11A and 11B are flow charts illustrating decoder operation in the second embodiment.
Figure 11B:
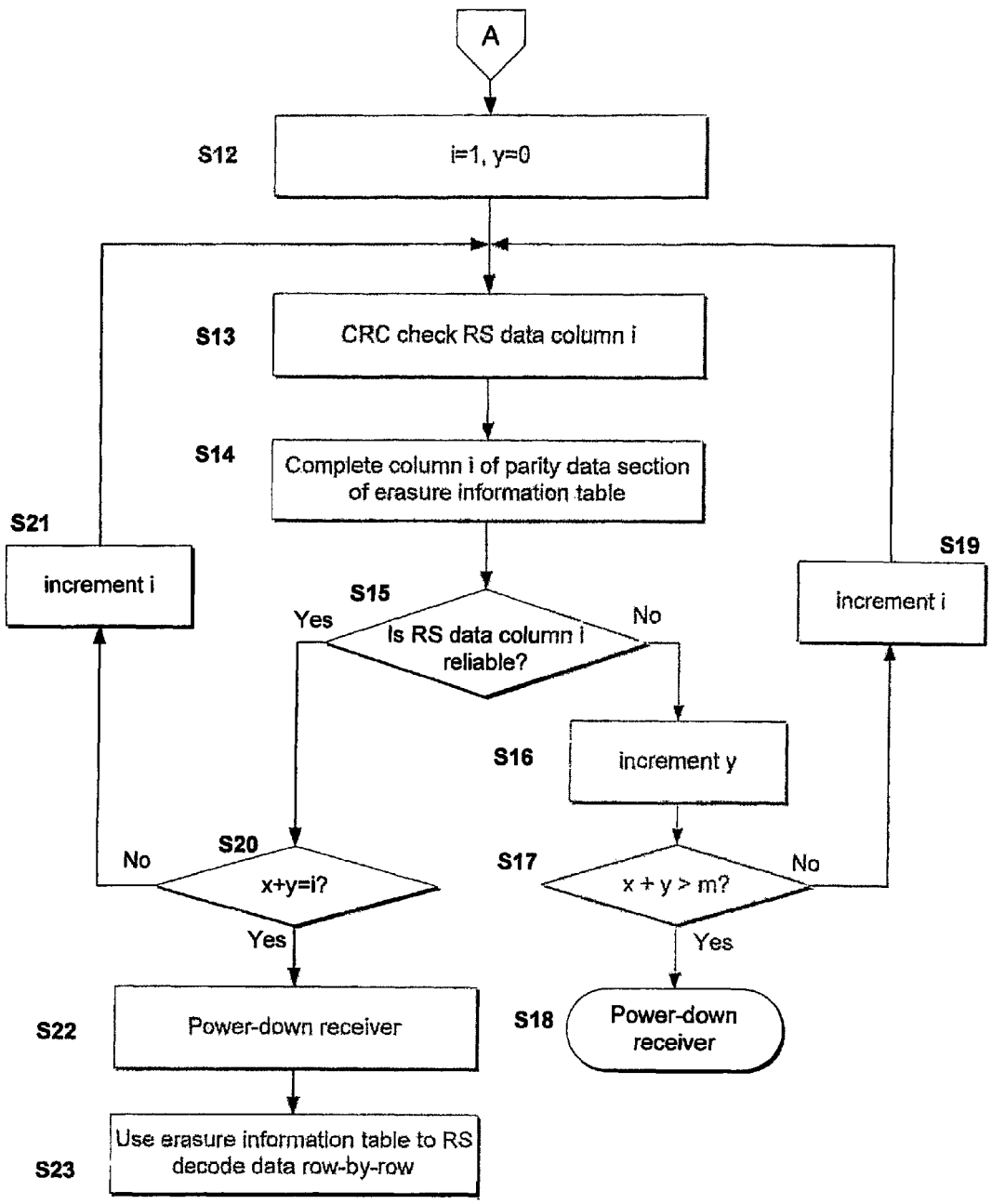

Referring now to FIGS. 11A and 11B, operation of the mobile terminal 20 in a second embodiment is now described in detail.

At step S1, the IP datagram buffer 65 is filled with received data, constituting the application data and zero-padding data frame 80. As will be appreciated, the zero-padding usually is not transmitted, so is replicated by the mobile terminal. The RS data has not been received at this point since it is transmitted after the application data frame 80. This application and padding data is written into a table like that shown in FIG. 9. The data frame 80 contains a number of elements equal to the number of rows in the data frame 80 multiplied by the number of columns therein. Each element comprises one byte of data. In this example, there are six columns of application and zero padding data and three columns of padding data (yet to be received), although it will be appreciated that this is merely an exampled selected to allow the invention to be easily understood.

At step S2, the erasure information table 98 is initialised. This involves including in each of the elements of the erasure information table 98 data a value indicating that data in a column of the data frame 80 corresponding to the element of the erasure information table is unreliable. Typically, the bit value "0" indicates unreliable data, although this is not essential. At step S3, the location of the zero padding is determined. This can utilise the table_boundary_flag described above, or can be carried out in any other way, e.g. by using information in the MPE section header. At step S4, elements of the erasure information table which corresponds to columns consisting of zero padding data are marked as being reliable. If the receiver 42 is not able to determine the location of the zero padding, for example because the MPE section header contains errors, then the columns of zero padding are marked as being unreliable.

At step S5, each of the datagrams is checked for errors e.g. by way of CRC data included in the corresponding MPE section. After step S5, the mobile terminal 20 knows which datagrams include errors, and which of those datagrams do not include errors. At step S6, elements of the erasure information table 98 corresponding to a column of the data frame 80 which include the whole or a part of a datagram which is determined to include one or more errors is unchanged, i.e. it remains as indicating unreliable data. For each of the application data columns of the data frame 80 which include only datagrams not including any errors, the corresponding element of the erasure table 98 is changed.

At step S7, x, which is the total number of columns of application data containing one or more errors is determined. The number of columns of application data containing one or more errors can then be used to determine how many columns of application data are to be received. This is described in the following steps.

At step S8 it is determined if the number of columns of application data containing errors is greater than an MPE-FEC correction capability, m. As in the previous embodiment, in this embodiment the MPE-FEC correction capability, m, is equal to three.

The application data can be decoded provided that a sufficient number of error-free columns of parity data are received. The number of error-free columns of parity data that are needed to decode the application data is equal to the sum of the number of columns of application data that contain one or more errors and the number of columns of parity data that contain one or more errors.

If the condition of step S8 is found to be false, the operation stops and the receiver 42 is powered down and enters sleep mode at step S9. Thus, no parity data is received. This is carried out since even if all the parity data elements are received error-free, the FEC decoder does not have the capability to decode the data. Therefore, controlling the receiver 42 to receive the parity data is an inefficient use of power resources. The data then is discarded without being decoded. If the condition of step S8 is found to be true, the operation proceeds to step S10.

At step S10, it is determined if x=0. This occurs when there are no errors present in the application data. If this is the case, the receiver 42 is powered-down and enters sleep mode at step S11. This is carried out because if no errors are present in the application data, no parity data is required. Thus, the parity data is not received, or not received fully. Therefore, power can be saved in the mobile terminal 20. If the condition of step S10 is found to be false, the operation proceeds to step S12.

In step S12, two counters are initialised. A first, i, is a count of the number of columns of parity data received. A second, y, is a count of the number of columns of parity data that are received with one or more errors.

The receiver 42 then begins to receive the parity data 95. Since the receiver 42 does not control when the parity data is transmitted, the step of receiving the parity data 95 may have commenced previously, e.g. immediately after receiving the application data. Parity data 95 is buffered if received prior to step S12 completing. At step S13, the column of parity data 95 is checked for errors e.g. using a CRC of the corresponding MPE-FEC section. At step S14, the parity data element 105 of the erasure information table 98 is marked accordingly.

At step S15, the reliability of the parity data element 105 of the erasure information table is checked.

If the condition of step S15 is false, the operation proceeds to step S16. At step S16, the counter y is incremented, to indicate that a parity data column containing one or more errors has been received. At step S17, it is determined if the total number of columns of application and parity data received containing errors is more than the MPE-FEC correction capability, m. If this is the case, the receiver 42 is powered down to sleep at step S18. If the condition of step S17 is false, the counter i is increment at step S19, and the operation returns to step S13.

If, at step S15, the erasure information table indicates that the data is reliable, the operation proceeds to step S20. At step S20, it is determined if the number of parity data columns received i, is equal to x+y, which is the total number of columns that contain errors in the application and parity data. That is, it is determined if sufficient parity data columns to correct all of the errors in the application and parity data have been received. If it is determined that this condition is false, the operation proceeds to step S21. At step S21, the counter i is incremented and the operation returns to step S13.

If it is determined that the condition of step S20 is true, then at step S22, the receiver 42 is powered-down. At step S23, the erasure information table 98 then is used to decode the data constituting the data frame 80 row by row. This is carried out by the RS decoder 69. The RS decoder 69 considers an element in a given row to include errors if the corresponding element in the erasure information table 98 indicates unreliable data. The result of this is that every element in a column is treated as including an error, even though there may be only one error present in that column. Furthermore, every element in a column can be treated as including an error if it includes part of a datagram in which an error is present, as determined by the CRC check on the MPE section including that datagram, even if the part of the datagram including an error actually is in an adjacent column. As such, the sensitivity of the RS decoding process implemented by the RS decoder 69 is compromised. However, the erasure information table 98 is required to include only a number of bits equal to the number of columns in the data frame 80, thereby saving a significant amount of memory in the mobile terminal 20. As long as the number of columns in the data frame 80 which are indicated as including unreliable data does not exceed the maximum number of errors that can be present whilst allowing the RS decoder 69 to correct satisfactorily errors in the data, then all the elements in the data frame 80 which include errors will necessarily be corrected.

Figure 9:
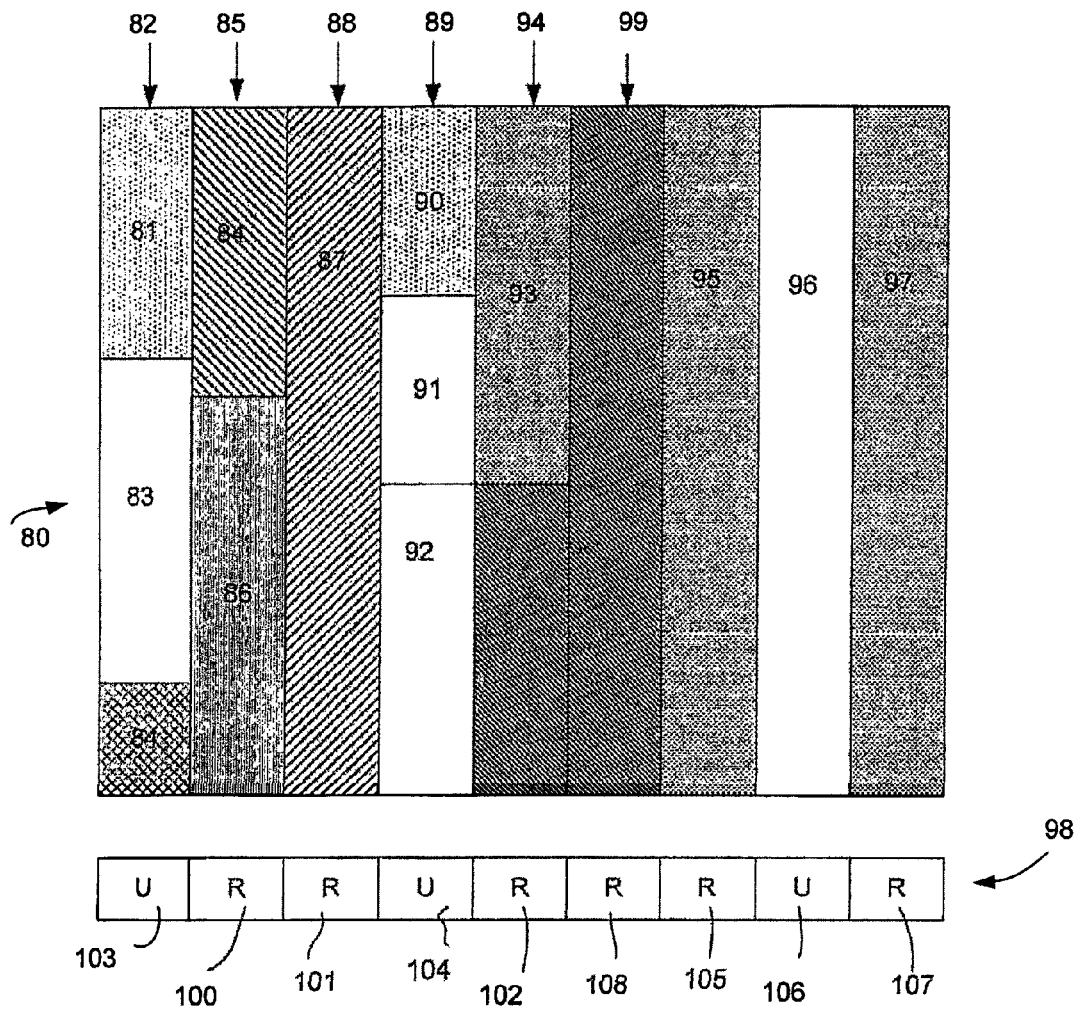
FIGS. 9 and 10 are schematic drawings of a coding array or data frame used to illustrate a second embodiment of the invention.

The operation of the mobile terminal will now be described as the first data frame 80 is received. At step S1, the IP datagram buffer 65 is filled with received data, constituting the application data and zero-padding data frame 80. At step S2, the erasure information table 98 is initialised. At step S3, the location of the zero padding is determined. At step S4, elements of the erasure information table which corresponds to columns consisting of zero padding data are marked as being reliable. In FIG. 9, only the sixth element 108 of the erasure information table 98 corresponds to a column, namely the sixth column 99, which includes only zero padding data.

At step S5, each of the datagrams is checked for errors e.g. by way of CRC data included in the corresponding MPE section. After step S5, the mobile terminal 20 knows which of the first to ninth datagrams 81, 83, 84, 86, 87, 90-93 includes errors, and which of those datagrams do not include errors. At step S6, the application data section of the erasure information table is completed. In the example illustrated in FIG. 10, the second and third columns 85, 88 and the fifth column 94 include datagrams which do not include any errors. Consequently, second, third and fifth elements, 100, 101 and 102 of the erasure information table 98 are marked as corresponding to reliable data in the data frame 80. Since the first and fourth columns 82 and 89 includes one or more datagrams including one or more errors, the first and fourth elements 103, 104 of the erasure information table 98 remain indicating unreliable data in the corresponding columns in the data frame 80.

At step S7, x, the total number of columns of application data containing one or more errors is found to be two. This indicates that two error-free columns of parity data should be received, to ensure that all the errors can be corrected.

At step S8, it is determined that x (which in this example has the value 2) is less than m (which has the value 3), thus the condition is false, and operation proceeds to step S10.

At step S10, it is determined if x=0. In this example x=2, so the process proceeds to step S12.

At step S12, the counters are initialised. At step S13, the first column of parity data 95 is checked for errors. This results in the first column of parity data 95 passing the check, i.e. no errors are present in this column. At step S14, the first parity data element 105 of the erasure information table 98 is marked accordingly. In this example, the first element 105 is changed at step S14 to show that the data in the corresponding parity data column 95 is reliable.

In step S15, the reliability of the first parity data element 105 of the erasure information table is checked. In this example, it indicates that the data is reliable, and the operation proceeds to step S20. In step S20, it is determined if sufficient parity data columns have been received to correct all of the errors in the application data. In this case, one error-free parity data column 95 is received and there are two application data columns that contain one or more errors. Thus, it is determined that this condition is false. At step S21 the counter i is incremented and the operation returns to step S13.

At step S13, the second column of parity data 96 is checked for errors. In the example of FIG. 9, this results in the second column of parity data 96 failing the check, i.e. one or more errors are present in this column. At step S14, the second parity data element 106 of the erasure information table 98 is marked accordingly, i.e. the second element 105 is left unchanged to show that the data in the corresponding parity data column 95 is unreliable. At step S15, it is determined that the second parity data column is unreliable, and the operation proceeds to step S16.

At step S16, the counter y is incremented to 1, to indicate that one parity data column containing one or more errors has been received. At step S17, it is determined if the total number of columns of application and parity data received containing errors is more than the MPE-FEC correction capability, m. In this case, three columns have been received with errors, therefore x+y=m and the result is false. This indicates that it still may be possible for the application data to be correctly decoded using the available parity data. Thus, the operation proceeds to step S19, and the counter i is incremented to three.

At Step S13, the third column of parity data 97 is checked for errors. In the example of FIG. 7, this results in the third column of parity data 97 passing the check, i.e. no errors are present in this column. At step S14, the third parity data element 107 of the erasure information table 98 is marked accordingly, i.e. the third element 107 is changed to show that the data in the corresponding parity data column 97 is reliable. At step S15, it is determined that the third parity data column is reliable, and the operation proceeds once again to step S20.

At step S20, it is determined if enough error-free parity data columns are received to correctly decode the application data. In this case, two error free RS data columns 95, 97 have been received, and there are two columns of application data 82, 89 that contain errors. Therefore, the condition is true and the operation proceeds to step S22. At step S22, the receiver 42 is powered-down and the reception of further parity data elements is stopped, although there are no more in this example. At step S23, the erasure information table 98 is used to decode the data constituting the data frame 80 row by row.

The operation of the mobile terminal 20 will now be described as the second data frame 80' is received. Steps S1 to S5 are performed in the same way as above. However, the CRC check determines that there are also errors in the fifth datagram 87 in the third column 88. Thus, at step S7, x is found to be equal to three. The conditions of steps S8 and S10 are again found to be false, so the operation proceeds to step S12, and the counter values are initialised.

At step S12, the CRC check of the first column determines that no errors are found. At step S14, the first parity data element of the erasure table is changed to show that the data in the corresponding parity data column 95 is reliable.

At step S15, the reliability of the first parity data element 105 of the erasure information table is checked. In this example, it indicates that the data is reliable, and the operation proceeds to step S20. At step S20 it is determined if the number of error-free parity data columns is equal to x, the number of application data columns that contain errors. In this example, one error-free parity data column 95 is received and there are three application data columns that contain one or more errors, thus it is determined that this condition is false. At step S21 the counter i is incremented and the operation returns to step S13.

Figure 10:
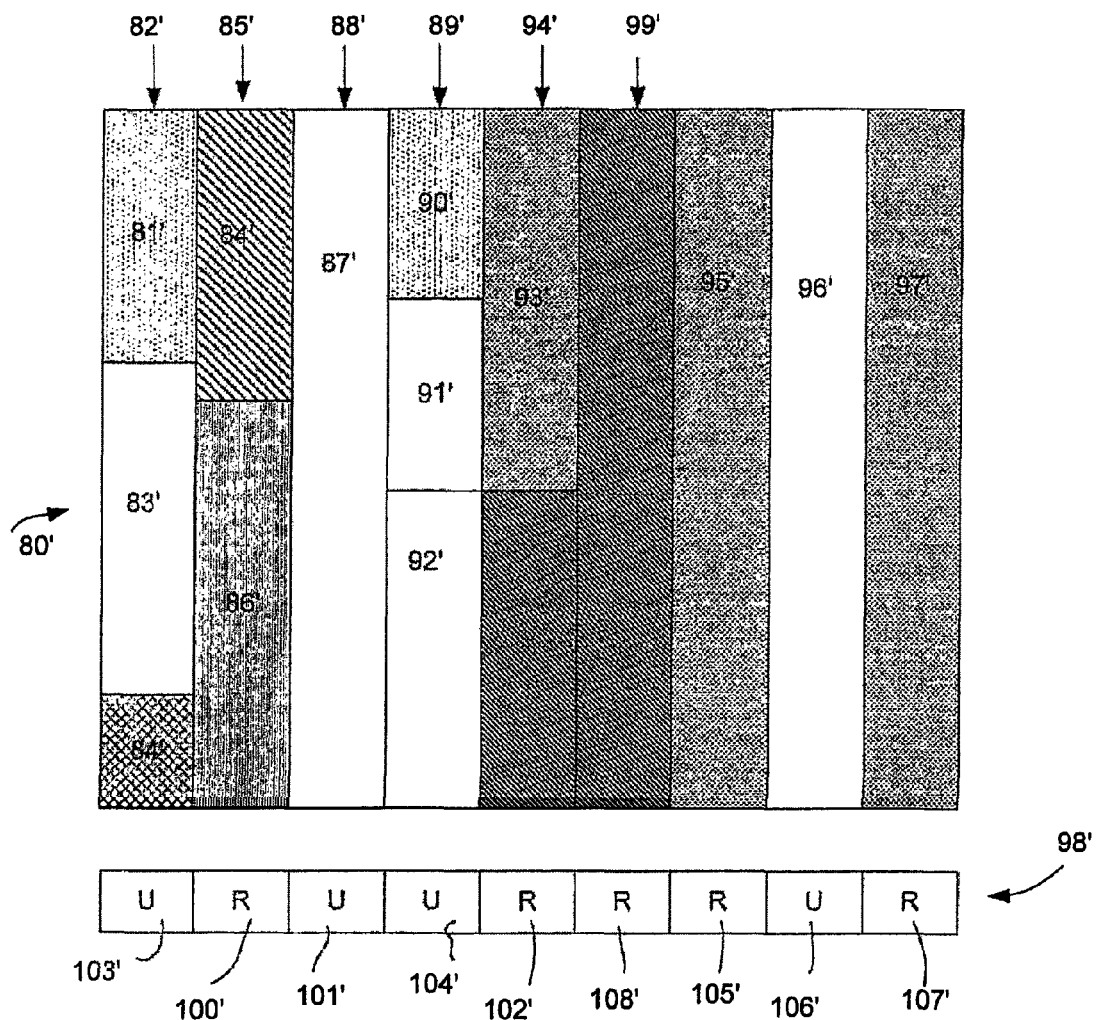

At step S13, the second column of parity data 96 is checked for errors. In the example of FIG. 10, this also results in the second column of parity data 96 failing the check, i.e. one or more errors are present in this column. At step S14, the second parity data element 106 of the erasure information table 98 is marked accordingly. At step S15, it is determined that the second parity data column is unreliable, and the operation proceeds to step S16.

At step S17, the counter y is incremented to 1, to indicate that one parity data column containing errors has been received. At step S18, it is determined if the total number of columns of application and parity data received containing errors is more than the MPE-FEC correction capability. In this case, four columns of application and parity data have now been received with errors. Since the MPE-FEC correction capability m is known to be three, this indicates that there are more errors in the application data than can be corrected, even if the remaining parity data columns are received without errors. Thus, there is no benefit in receiving further parity data. The operation thus proceeds to step S18, and the receiver 42 is powered-down to sleep. The data then is not decoded. This can save power in the mobile terminal 20.

It can be envisaged that in another data frame, two columns of the application data may contain errors, but there is a maximum of one unreliable error in a single row. In such a case, performing the method of the second embodiment requires two error-free parity data columns to be received, while performing the method according to the first embodiment requires only one column of error-free parity data to be received. Thus, it may be preferable to use the method according to the first embodiment when power is limited in the receiving device. However, one advantage of performing the operation according to the second embodiment is that the erasure information table comprises 9 bits of data compared to 126 bits of data in the second embodiment. Accordingly, the first embodiment may be preferred when it is desirable to reduce the amount of memory required to decode the received data.

In other embodiments (not shown) units of the erasure information table can be comprised of any suitable number of elements, for example to provide a compromise between resolution and memory. In another example the erasure information table can be represented by a list of items, each item including an element address and an error indication, each item in the list identifying a boundary of a sequence of data units having the same error status In the above embodiments, parity data columns can be punctured, by discarding them before transmission. The number of punctured parity columns may vary dynamically between MPE-FEC frames and can be calculated as 63-last_section_number, when there are 64 columns of RS data. Puncturing decreases the overheads introduced by the parity data and thus decreases the needed bandwidth. However, the disadvantage of puncturing is an effectively weaker code rate. Also, the maximum error capability is reduced by the number of punctured columns. In general, for an erasure Reed Solomon decoder with the parameters RS (N, K) where N is the total number of columns and K is the number of application data columns, the MPE-FEC correction capability is given by (N-K-punctured columns). The opposite effect can be obtained by intentionally introducing zero-valued padding columns. This makes the code stronger but at the expense of bandwidth.

In another embodiment (not shown) and erasure information table is not provided and erasure information is not used. When erasure information is not used, the MPE-FEC correction capability is reduced by a factor of two, i.e. only half the number of unreliable elements is acceptable if the application data is to be decoded correctly. Thus in the case of the data frame 80, the parity data can only be used to correct the application data is there is a maximum of one error in each row of the application data. In general, for a non-erasure Reed Solomon decoder with the parameters RS (N, K) where N is the total number of columns and K is the number of application data columns, the MPE-FEC correction capability is given by (N-K-punctured columns)/2.

It will be appreciated that many modifications may be made to the embodiments hereinbefore described. For example, the mobile terminal 20 may be a Personal Distal Assistant (PDA) or other mobile terminal capable at least of receiving signals via the first communications network 21. The mobile terminal 20 may also be semi-fixed or semi-portable, such as a terminal carried in vehicle, such as a car.

Moreover, the invention has application in any forward error correction system, not just that described in the embodiments, and is applicable to rows and columns of different lengths.

Still further, although the processing has been described in respect of rows of a coding table, the table may be replaced by discrete 'words', which, if brought together, could form a coding table.

The invention is not limited to Reed-Solomon decoders, or the use of Reed-Solomon parity data, but applies also to other FEC techniques.

The invention claimed is:

1. A method of operating a receiver including a forward error correction decoder, the method comprising:
   receiving application data elements of a data frame;
   determining an error status of the received application data; and
   selectively receiving parity data of the data frame on the basis of the error status,
   wherein selectively receiving parity data of the data frame on the basis of the error status comprises, in response to a determination that the application data contains more errors than can be corrected by parity data, powering-down the receiver without receiving all of the parity data.

2. A method as claimed in claim 1, comprising responding to a determination that the application data is error-free by powering-down the receiver without receiving all of the parity data.

3. A method as claimed in claim 1, comprising operating the receiver to receive parity data, and responding to a determination that an amount of error-free parity data which is sufficient to correct errors in the application data has been received by powering-down the receiver.

4. A method as claimed in claim 3, comprising determining an error status of the received parity data, and responding to a determination that the application data and the parity data together contain more errors than can be corrected by the parity data by powering-down the receiver without receiving all of the parity data.

5. A method as claimed in claim 1, wherein the data is able to be arranged into a table comprising rows and columns, and the error status is calculated on the basis of the row or rows with the greatest number of errors.

6. A method as claimed in claim 1, wherein the data is able to be arranged into a table comprising rows and columns, and the error status is calculated on the basis of the number of columns of data containing one or more errors.

7. Apparatus comprising;
   a receiver arranged to receive application data elements of a data frame;
   a forward error correction decoder arranged to determine an error status of the received application data; and
   a controller arranged to control the receiver selectively to receive parity data of the data frame on the basis of the error status,
   wherein the controller is arranged to control the receiver selectively to receive parity data of the data frame on the basis of the error status by being responsive to a determination that the application data contains more errors than can be corrected by parity data to power-down the receiver without receiving all of the parity data.

8. Apparatus as claimed in claim 7, in which the controller is responsive to a determination that the application data is error-free to power-down the receiver without receiving all of the parity data.

9. Apparatus as claimed in claim 7, in which the controller is arranged to operate the receiver to receive parity data, and the controller is responsive to a determination that an amount of error-free parity data which is sufficient to correct errors in the application data has been received to power-down the receiver.

10. Apparatus as claimed in claim 9, in which the controller is arranged to operate the receiver to receive parity data, and the controller is responsive to a determination that the application data and the parity data together contain more errors than can be corrected by the parity data to power-down the receiver without receiving all of the parity data.

11. Apparatus as claimed in claim 7, wherein the data is able to be arranged into a table comprising rows and columns, and the forward error correction decoder is arranged to calculate the error status on the basis of the row or rows with the greatest number of errors.

12. Apparatus as claimed in claim 7, wherein the data is able to be arranged into a table comprising rows and columns, and the forward error correction decoder is arranged to calculate the error status on the basis of the number of columns of data containing one or more errors.

13. An apparatus as claimed in claim 7, wherein the apparatus is a battery-powered digital broadcast receiver.

14. A DVB receiver including apparatus as claimed in claim 7, wherein the apparatus is a DVB receiver.

15. Computer-readable media having stored thereon computer code comprising:
   computer code for operating a receiver including a forward error correction decoder to receive application data elements of a data frame;
   computer code for operating the receiver to determine an error status of the received application data; and
   computer code for operating the receiver to selectively receive parity data of the data frame on the basis of the error status powering-down the receiver without receiving all of the parity data in response to a determination that the application data contains more errors than can be corrected by parity data.

16. Apparatus comprising:
   receiver means arranged to receive application data elements of a data frame;
   forward error correction decoder means arranged to determine an error status of the received application data; and
   controller means arranged to control the receiver means selectively to receive parity data of the data frame on the basis of the error status, wherein the controller means is arranged to control the receiver selectively to receive parity data of the data frame on the basis of the error status by being responsive to a determination that the application data contains more errors than can be corrected by parity data to power-down the receiver without receiving all of the parity data.

17. Apparatus as claimed in claim 16, in which the controller means is responsive to a determination that the application data is error-free to power-down the receiver means without receiving all of the parity data.

* * * * *

UNITED STATES PATENT AND TRADEMARK OFFICE
CERTIFICATE OF CORRECTION

PATENT NO. : 8,230,293 B2  Page 1 of 1
APPLICATION NO. : 11/994030
DATED : July 24, 2012
INVENTOR(S) : Pekonen It is certified that error appears in the above-identified patent and that said Letters Patent is hereby corrected as shown below:

Claim 15, col. 18, line 52, between "status" and "powering-down" insert --by--.

Signed and Sealed this
Second Day of October, 2012

David J. Kappos
*Director of the United States Patent and Trademark Office*